(12) United States Patent
Goodwin et al.

(10) Patent No.: US 6,927,462 B2
(45) Date of Patent: Aug. 9, 2005

(54) METHOD OF FORMING A GATE CONTACT IN A SEMICONDUCTOR DEVICE

(75) Inventors: Francis Goodwin, Mechanicsville, VA (US); Jonathan Philip Davis, Mechanicsville, VA (US); Michael Rennie, Mechanicsville, VA (US)

(73) Assignee: Infineon Technologes Richmond, LP, Sandston, VA (US)

( * ) Notice: Subject to any disclaimer, the term of this patent is extended or adjusted under 35 U.S.C. 154(b) by 0 days.

(21) Appl. No.: 10/232,786

(22) Filed: Aug. 28, 2002

(65) Prior Publication Data

US 2004/0043592 A1 Mar. 4, 2004

(51) Int. Cl.⁷ .............................................. H01L 29/76
(52) U.S. Cl. ...................... 257/383; 257/413; 257/752
(58) Field of Search ................................ 257/383, 413, 257/752, 763, 288, 382, 751, 401, 406, 408, 377, 376, 511, 512, 514, 515, 520, 535, 202, 205, 206, 210, 211; 438/672, 656, 621, 597, 586, 303

(56) References Cited

U.S. PATENT DOCUMENTS

| | | | | | |
|---|---|---|---|---|---|
| 5,807,779 A | * | 9/1998 | Liaw | ............................ | 438/279 |
| 6,083,794 A | * | 7/2000 | Hook et al. | .................. | 438/286 |
| 6,094,386 A | * | 7/2000 | Kohyama | .................... | 365/200 |
| 6,117,723 A | * | 9/2000 | Huang | ........................... | 438/238 |
| 6,133,083 A | * | 10/2000 | Lin et al. | ..................... | 438/238 |
| 6,153,459 A | * | 11/2000 | Sun | .............................. | 438/238 |
| 6,429,068 B1 | * | 8/2002 | Divakaruni et al. | ........ | 438/243 |
| 6,486,505 B1 | * | 11/2002 | Rupp et al. | .................. | 257/306 |

* cited by examiner

*Primary Examiner*—Laura M Schillinger
(74) *Attorney, Agent, or Firm*—Slater & Matsil, L.L.P.

(57) ABSTRACT

A processing sequence for definition of gate contacts can be implemented using either a deep ultra-violet (DUV) or mid ultra-violet (MUV) positive resist processing and supports the use of a reticle that integrates contacts to various regions including gates, sources and drains of various devices. In a one example, the wafer is coated with a planarizing anti-reflective coating (ARC), which then supports imaging of gate contacts using a positive DUV or MUV resist. This processing allows the nitride cap of certain transistor gates to be replaced with an oxide. In this example, the ARC can serve as an etch guide for selective removal of a film.

5 Claims, 6 Drawing Sheets

METHOD OF FORMING A GATE CONTACT IN A SEMICONDUCTOR DEVICE

TECHNICAL FIELD

The present invention relates generally to semiconductor devices and more particularly to a method of forming a gate contact in a semiconductor device.

BACKGROUND

As is known in the art, dynamic random access memories (DRAMs) are used extensively in a wide range of applications. A DRAM typically includes an array of memory cells, each cell comprising an access transistor, typically a metal oxide semiconductor field effect transistor (MOSFET), coupled in series with a capacitor.

A portion 10 of an array is shown in FIG. 1, which illustrates two complementary pairs of bitlines BL and BL'. While this figure only illustrates eight memory cells, it is known to fabricate DRAMs with millions of cells. Each bitline pair BL and BL' is coupled to equalization/precharge circuitry and a sense amplifier, collectively labeled 12. Although not illustrated, many bitline pairs (and respective circuitry 12) are typically provided.

Each memory cell includes an access transistor 14 coupled in series with a capacitor 16. As shown in the figure, one source/drain region of transistor 14 is coupled to the bitline BL (or BL'). The other source/drain region is coupled to one of the plates of respective capacitor 16. The other plate of capacitor 16 is coupled to a common plate reference voltage.

To select a particular memory cell, a select voltage is applied to one of the wordlines WL0–WL3. As illustrated in FIG. 1, the gate of each pass transistor 14 is coupled to one of the wordlines WL0–WL3. As shown, each wordline will extend across other bitlines and couple to the gates of pass transistors of memory cells coupled to those bitlines.

The bitline pair BL0 and BL0' (or BL1 and BL1') is selected by applying a select voltage to the select transistors 18. When the select transistors 18 are selected, the differential voltage signal across the bitline pair will be transferred to input/output lines I/O and I/O'. In this manner, the state stored in the one memory cell that is coupled to the selected wordline and selected bitline will be transferred to the input/output lines.

As shown in the simplified drawing of FIG. 1, the DRAM device includes transistors (e.g., 14) in the array and other transistors (e.g., 18) in the support circuitry. To interconnect these devices, various portions of each of these transistors will need to be connected, typically using metal wirings. The preferred embodiments of the present invention relate to methods of connecting to these portions of the transistor devices.

SUMMARY OF THE INVENTION

In an effort to reduce the overall capital investment required to support introduction of next generations of technology, it is desirable to development an interconnect design that incorporates contacts to the bitlines, source/drains and gates of various transistors into a signal layout. This process is complicated in transistor designs that include a nitride hard mask or cap layer over the transistor gate.

A preferred embodiment of the present invention provides a processing sequence for definition of gate contacts that can be implemented, for example, using either a deep ultra-violet (DUV) or mid ultra-violet (MUV) positive resist processing and supports the use of a reticle that integrates contacts to various regions including the bitlines, the gates and the source/drains of various devices.

In a preferred embodiment, the wafer is coated with a planarizing anti-reflective coating (ARC), which will then support imaging of gate contacts using a positive DUV or MUV resist. This processing allows the nitride cap of certain transistor gates to be replaced with an oxide. In this embodiment, the ARC can serve as an etch guide for selective removal of a film.

In one exemplary embodiment, a transistor is formed. The transistor includes a gate overlying a semiconductor region (e.g., silicon substrate) and an insulating layer (e.g., a nitride cap) overlies the gate. A planarizing layer (e.g., anti-reflective coating) is formed over the semiconductor region adjacent the gate to a thickness substantially the same as that of the gate. A resist layer (e.g.,positive resist) is formed over the transistor to expose at least a portion of the insulating layer overlying the gate. The exposed portion of the insulating layer is then substantially removed. After removing the resist layer, and possibly the planarizing layer, a dielectric layer is formed over the transistor. A via can then be etched through the dielectric layer to expose a portion of the gate beneath the exposed portion of the insulating layer.

An advantage of a preferred embodiment of the present invention is a that single resist pattern can be used to expose portions of transistor gates as well as semiconductor substrate (e.g., source/drain regions). By replacing the nitride cap with an oxide layer for those transistors with gates to be exposed, these gates can be contacted while the gates of other devices remain protected.

This preferred embodiment also simplifies the overall contact process by relaxing the registration and critical dimension requirements. Because the ARC is used as an etch guide and the process replaces the nitride dielectric with an oxide dielectric, the impact of lithography process variations are reduced. This also allows greater flexibility in manufacturing, such as imaging on an I-line exposure instead of a DUV system (saving process cost).

The foregoing has outlined rather broadly the features and technical advantages of embodiments of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a dynamic random access memory device. The invention may also be applied, however, to other semiconductor devices such as those using CMOS, bipolar and BiCMOS processes. The concepts of the present invention can be used with a variety of semiconductor devices including memory devices such as DRAM, SRAM (static random access memories), and non-volatile memories such as EPROMs (erasable programmable random access memories), EEPROMs (electrically erasable programmable random access memories), flash, logic devices such as controllers and processors, and embedded devices that include both logic and memory, as examples.

Figure 1:
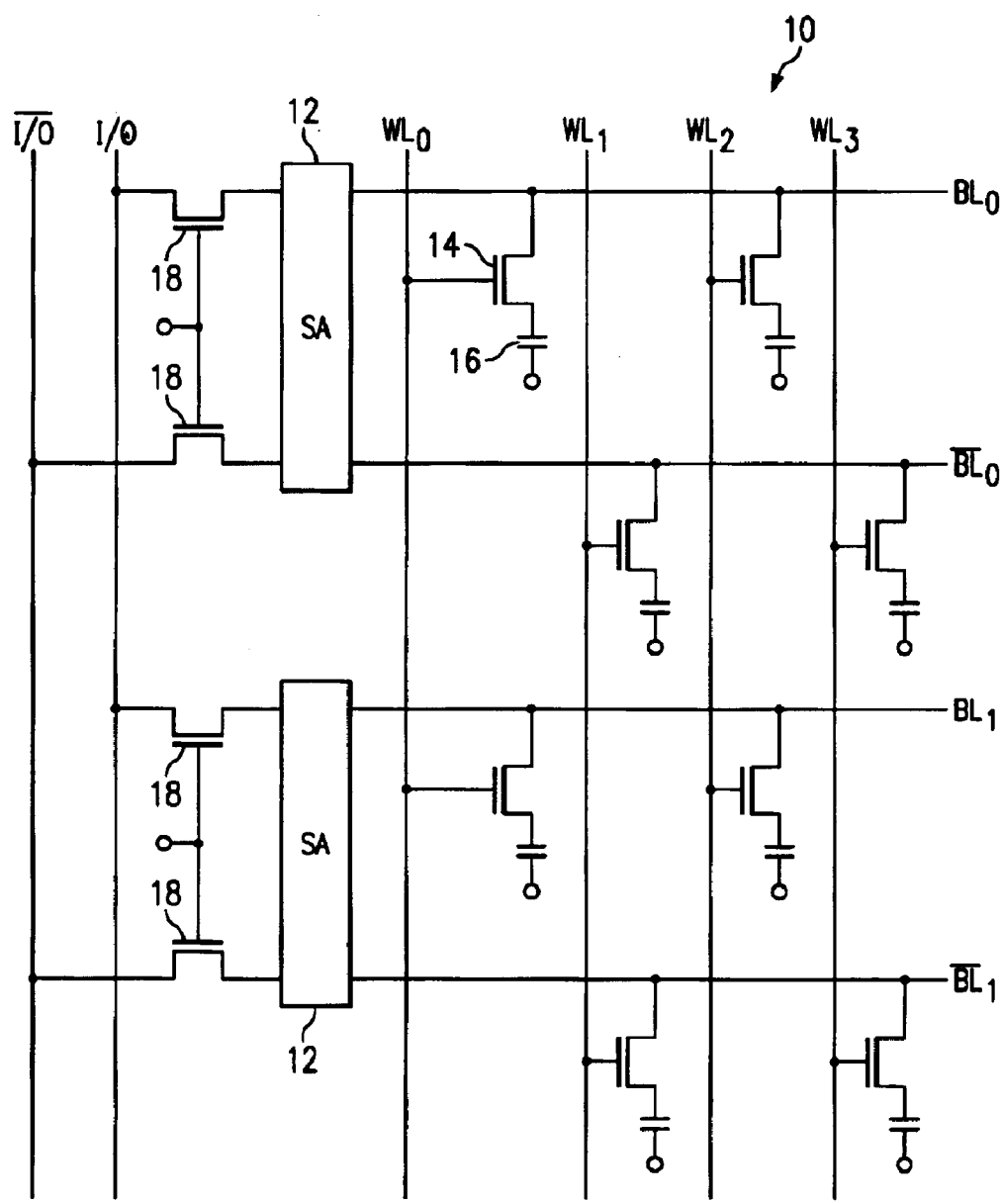
FIG. 1 illustrates a block diagram of a conventional memory array.
Figure 2:
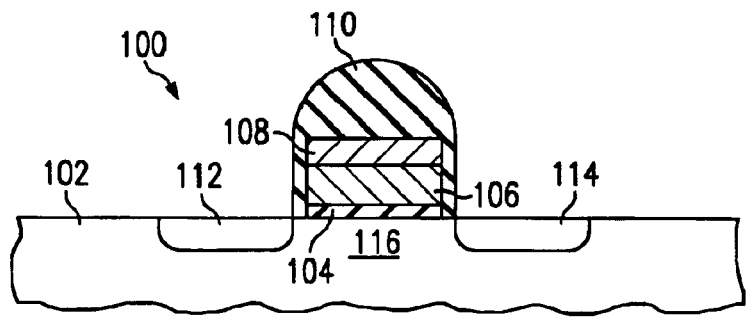
FIGS. 2–6 illustrate cross-sectional views of a preferred embodiment process flow to form gate contacts.

A first embodiment process flow will now be described with respect to FIGS. 2–6. FIG. 2 shows a transistor device 100 formed in a semiconductor region 102. Semiconductor region 102 can be any semiconductor region capable of supporting a transistor device. For example, semiconductor region 102 can be a semiconductor substrate, a doped region formed within a semiconductor substrate (e.g., a well or a tub), or a semiconductor layer formed over another layer (e.g., an epitaxial layer or a silicon over insulator layer).

Transistor device 100 includes a gate stack formed from gate dielectric 104 and, in this case, two conductive layers 106 and 108. In the preferred embodiment, gate dielectric 104 is an oxide layer (e.g., silicon dioxide). In other embodiments, a nitride layer (e.g., $Si_3N_4$) or combination oxide and nitride layer (e.g., NO, ON, ONO, oxynitride) could be used.

In a preferred embodiment, the gate includes a doped polysilicon layer 106 and a silicide layer 108. The preferred silicide layer is tungsten suicide although it is recognized that other silicide materials such as titanium silicide, cobalt silicide, or nickel silicide can be used. Alternatively, other conductive layers such as aluminum, aluminum alloys, or tungsten could be included in the gate stack, in addition to or instead of either or both of layers 106 and 108. In the illustrated example, conductive layers 106 and 108 comprise the gate of the transistor device 100.

As shown in FIG. 2, the gate stack is encapsulated with an insulating cap layer 110. In the preferred embodiment, the cap layer 110 is formed of a nitride such as silicon nitride (e.g., $Si_3N_4$). The nitride cap 110 protects the gate during subsequent processing. As will be discussed below, however, it is desirable to remove a portion of the cap layer 110 to allow for electrical connection to the gate 106/108.

Source/drain regions 112 and 114 are formed adjacent the gate stack and are aligned with the gate stack. The source/drain regions 112 and 114 typically comprise heavily doped silicon, although other materials are possible. For n-channel transistors, the source/drain regions 112 and 114 are preferably doped with phosphorus or arsenic. For p-channel transistors, the source/drain regions 112 and 114 are preferably doped with boron. A channel region 116 is disposed in the semiconductor region 102 between the source/drain regions 112 and 114 and beneath the gate 106/108.

As is known in the art, the transistor device 100 can be formed by sequentially forming the gate stack layer (e.g., an oxide layer 104 followed by polysilicon layer 106 followed by silicide layer 108) and then patterning the gate stack layer to form the gate. After the nitride cap layer 110 is formed, the source/drain regions 112 and 114 can be formed to be aligned with the gate.

While not shown, it is understood that other elements could be included in the semiconductor device. For example, isolation regions (not shown) are typically formed to electrically isolate the transistor device 110 from other devices on the wafer. In the preferred embodiment, shallow trench isolation is used although it is understood that other isolation methods such as field isolation can alternatively be used.

Figure 3:
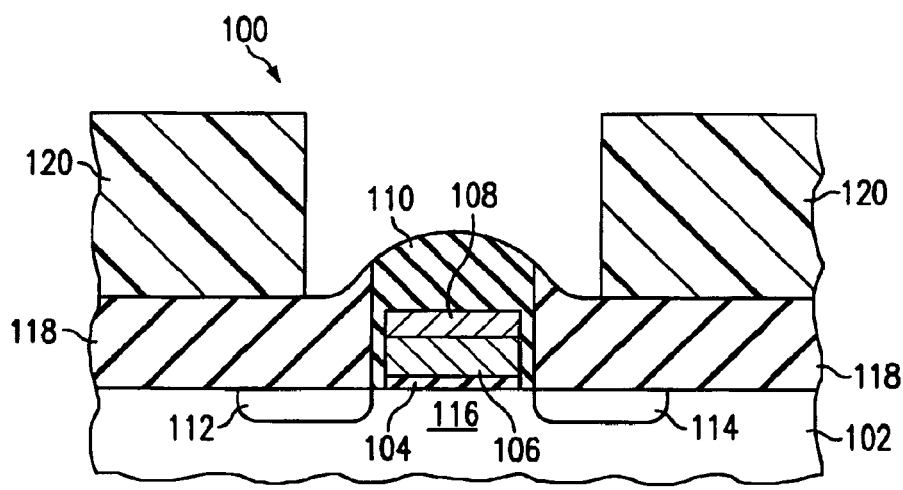

Referring now to FIG. 3, a planarizing layer 118 is formed over the device, preferably to a thickness that is the same as the thickness of the gate stack including nitride cap 110. In the preferred embodiment, the planarizing layer 118 is an anti-reflective coating (ARC) material such as a organic polymer, for example, Shipley's AR7. The ARC material is useful since it is compatible with the preferred deep ultra-violet (DUW) or mid ultra-violet (MUV) lithography used to pattern the resist 120. In the preferred embodiment, the ARC layer 118 is formed to a thickness of between about 135 nm and about 170 nm (preferably about 135 nm) over the device and is planarized, preferably within the ARC coating process.

In an alternate embodiment, the planarizing layer 118 could be a different material such as an oxide layer, which would be planarized using a chemical-mechanical polishing or thermal reflow process. The advantage of using an oxide layer as planarizing layer 118 is that it need not be removed after a portion of the nitride cap layer 110 is removed.

A masking layer 120 is formed over the device 100 to expose at least a portion of the nitride cap layer 110 overlying the gate 106/108. While not clear from the cross-sectional view, it should be understood that the contact portion of the gate 106/108 might include the entire gate or only a portion of the gate. This portion may overlie the channel 116 or may be offset from the channel (e.g., overlying isolation regions). The exact location of the contact portion of the gate is not critical to the general concepts of the invention.

In the preferred embodiment, masking layer 120 is a positive photoresist. It is understood, however, that negative resists could alternatively be used. As discussed above, the resist 120 is preferably compatible with a deep ultra-violet (DUV) or mid ultra-violet (MUV) lithography system. For example, the resist may be JSR M91Y DUV or TOK 3150 MUV resist or any similar type of resist.

Figure 4:
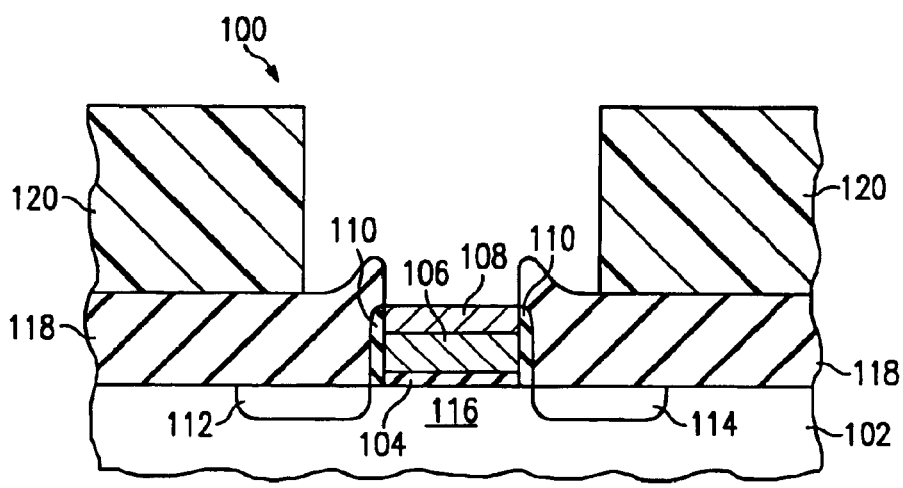

Referring now to FIG. 4, the exposed portion of the nitride cap layer 110 is removed. During the nitride etch, an ARC open process is used to remove any of the planarizing ARC left over the nitride cap during the coating process and the remaining ARC 118 is then used to align the nitride etch process over the gate stack and to protect the silicon substrate 102 from etch damage. In the preferred embodiment, the ARC open etch is performed using an oxygen ($N_2/O_2$) or chlorine ($Cl/O_2$) based plasma etch and the nitride etch performed using a fluorine based etch chemistry such as $CF_4/CHF_3$ or an argon based plasma ($Ar/CHF_3/CF_4$). Alternatively, other chemistries could be used for the ARC open etch and nitride etch.

Figure 5:
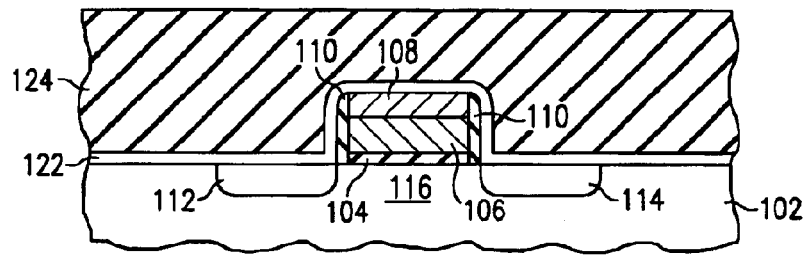

After performing the nitride etch, the resist 120 and the ARC layer 118 are stripped and cleaned. As shown in FIG. 5, a nitride liner 122 is formed over the device including over the gate 106/108. The nitride liner is typically between about 10 and about 20 run (preferably about 15 nm) thick and, as an example, is formed by low-pressure chemical vapor deposition (LPCVD). The nitride liner 122 serves to protect the underlying semiconductor (or gate) materials during the subsequent via contact etch. Accordingly, nitride liner 122 could be replaced with another material that performs this function (or eliminated altogether).

A dielectric layer 124 is deposited over the wafer. In the preferred embodiment, the dielectric layer 124 comprises a doped glass such as BPSG (borophosphosilicate glass). In alternate embodiments, other dielectrics such as other glass layers (e.g., PSG) or an undoped oxide (e.g., $SiO_2$) layer could be used. In the preferred embodiment, the BPSG layer is deposited to a thickness of between 450 and about 650 nm (preferably about 550 nm) and then polished back to the film stack thickness (i.e., the thickness of the gate stack including nitride cap 110).

The processing described to now shows a transistor where the cap nitride 110 has been replaced with an oxide film. With this scenario, the gate 106/108 is covered by the same material as the source/drain regions 112 and 114 and therefore can be exposed using the same processing steps.

Figure 6:
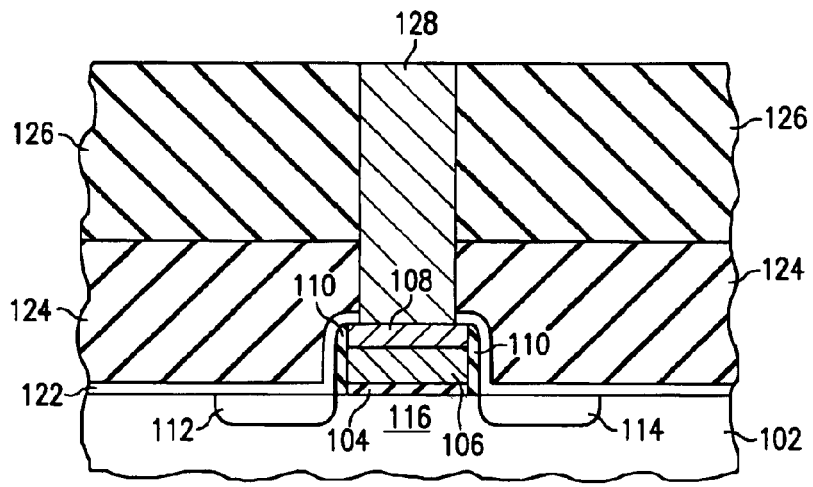

Referring to FIG. 6, a second dielectric layer 126 is formed over dielectric layer 124. In the preferred embodiment, dielectric layer 126 is an oxide layer formed by the decomposition of tetraethyloxysilane (TEOS). Alternatively, dielectric layer 126 can comprise other insulating materials. Dielectric layer 126 is deposited to a thickness of between about 300 and about 450 nm (preferably about 350 mn) and serves as an interlevel dielectric to insulate the transistor device 110 from overlying metal layers (not shown).

As will be discussed with respect to FIG. 11 below, a hard mask layer can be formed over the dielectric layer 124/126. If used, the hard mask is preferably undoped poly, although other materials such as silver nitrate could be used.

Finally, a contact via is etched through dielectric materials 124 and 126 to expose the gate 106/108. The contact etch can be performed using a patterned photoresist (not shown) or hard mask (not shown.). In the preferred embodiment, the contact etch comprises of a silicon oxide etch chemistry such as $CF_4/CHF_3$ to enable a good etch stop on the silicide 108 on top of device 100. The contact hole can then be filled with a conductive material 128 such at tungsten. Other conductors such as aluminum, aluminum alloys, and copper could alternatively be used.

As discussed above, one of the advantages of the process of the preferred embodiment is that gate 106/108 can be physically accessed using the same steps as when accessing the semiconductor region 102. FIGS. 7–12 are provided to more clearly demonstrate this advantage.

Figure 7:
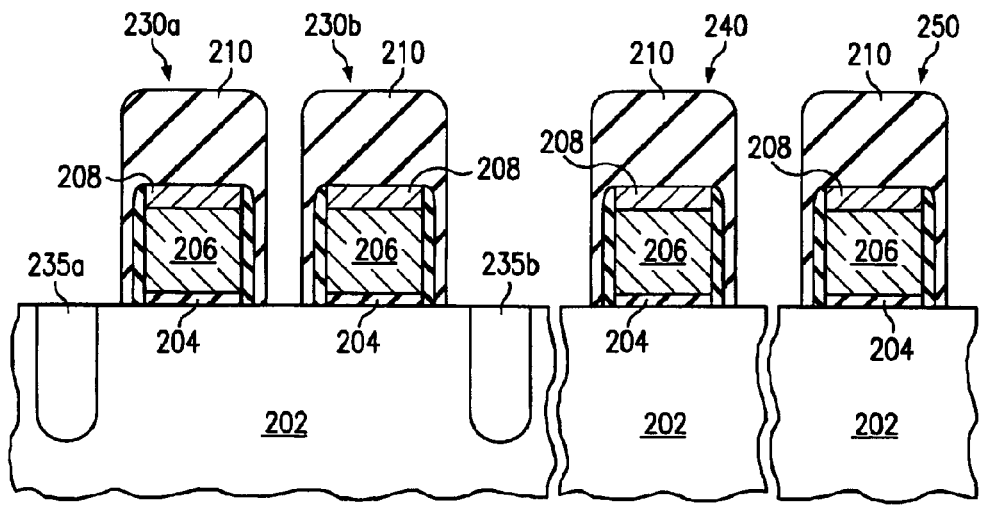
FIGS. 7–12 illustrate cross-sectional views of a DRAM at various stages of fabrication in accordance with a process flow of the present invention.

In the example of FIG. 7, four transistors are shown. The first two transistors 230a and 230b (collectively referred to as 230) are access (pass) transistors for a DRAM cell. Transistors 230 can also be referred to as array transistors. As discussed above, a DRAM cell includes an access transistor 230 coupled in series with a capacitor 235. The illustrated embodiment shows trench capacitors, which include a first plate of polysilicon in the trench a second plate comprising the substrate surrounding the trench. Although not explicitly shown, a dielectric layer is disposed between the two plates. The present invention would work equally well with other type capacitors, e.g., stack capacitors.

FIG. 7 also illustrates two transistors 240 and 250 from the peripheral or support circuitry. The transistors 240 and 250 form devices such as the input/output path circuitry, the address and data buffers, the decoders and control circuits. Transistor 240 is provided to represent a peripheral transistor for which one of the source/drain regions will be contacted. Transistor 250 represents a peripheral transistor for which the gate will be contacted. It is understood that any practical device will include a large number of transistors. Some will have only one element contacted while others will have more than one element contacts and yet others will have no elements contacted. Transistors 240 and 250 are provided to represent all of these possibilities.

Due to the similarities of the embodiment shown in FIGS. 7–12 with that discussed above with respect to FIGS. 2–6, these latter figures will be discussed only briefly. It should be understood, however, that all of the discussion and alternatives presented above with respect to FIGS. 2–6 apply to the embodiments of FIGS. 7–12 and vice versa.

FIG. 7 shows the transistors 230, 240 and 250 having been formed as discussed above. For the purpose of this discussion it is assumed that the trench capacitors 235 have already been formed and are properly coupled to the access transistors 250. In other words, each access transistor 250 is adjacent a respective one of the trench capacitors. In a one-gigabit DRAM, over one billion trench capacitors will be formed. As discussed above, each access transistor 230, as well as each peripheral transistor 240/250 includes a gate 206/208 encapsulated by a cap layer 210.

Figure 8:
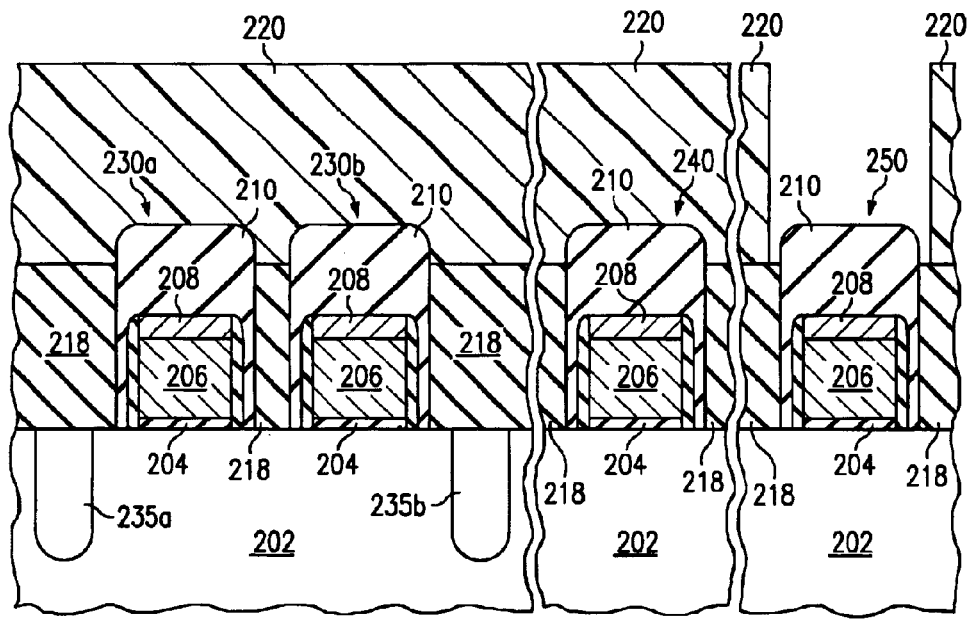

Referring now to FIG. 8, planarizing layer 218, preferably an anti-reflective coating layer, is formed over the device (including transistors 230, 240 and 250). A resist layer 220 is then formed over the ARC layer 218 and patterned to expose a portion of nitride cap layer 210 of transistor 250. Leaving the ARC layer 218 below the cap nitride allows for a large critical dimension when exposing the nitride cap 210. This may allow either DUV or I-line processing, depending on the final dimensions.

Figure 9:
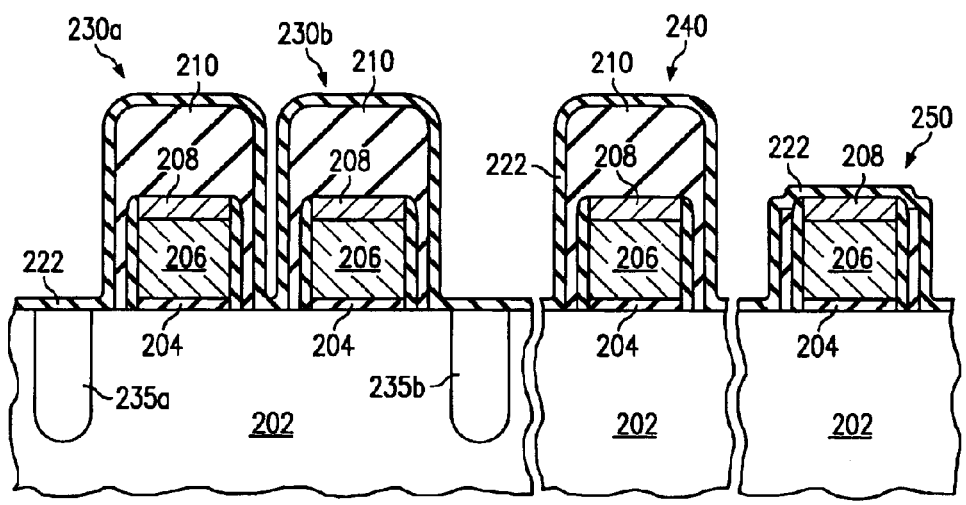

Referring to FIG. 9, the exposed portions of the nitride cap layer 210 are removed from transistor 250. Due to the resist layer 220, the array transistors 230 and the other peripheral transistors 240 are not affected by this etch. FIG. 9 also shows that the resist 220 and ARC layer 218 have been removed and that a nitride liner 222 has been deposited (e.g., by LPCVD).

Figure 10:
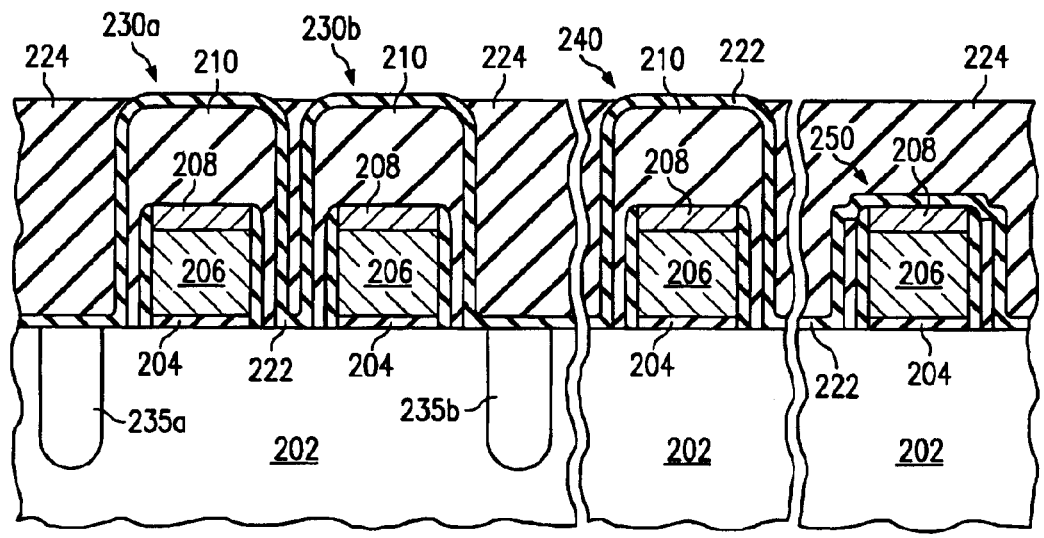

As shown in FIG. 10, a BPSG (or other dielectric) layer 224 is deposited, for example by chemical vapor deposition. This layer 224 is then wet annealed using a steam ambient to enable good gap fill with low thermal budget, typically about 800° C. The dielectric layer 224 can then be planarized using a chemical-mechanical polish.

Figure 11:
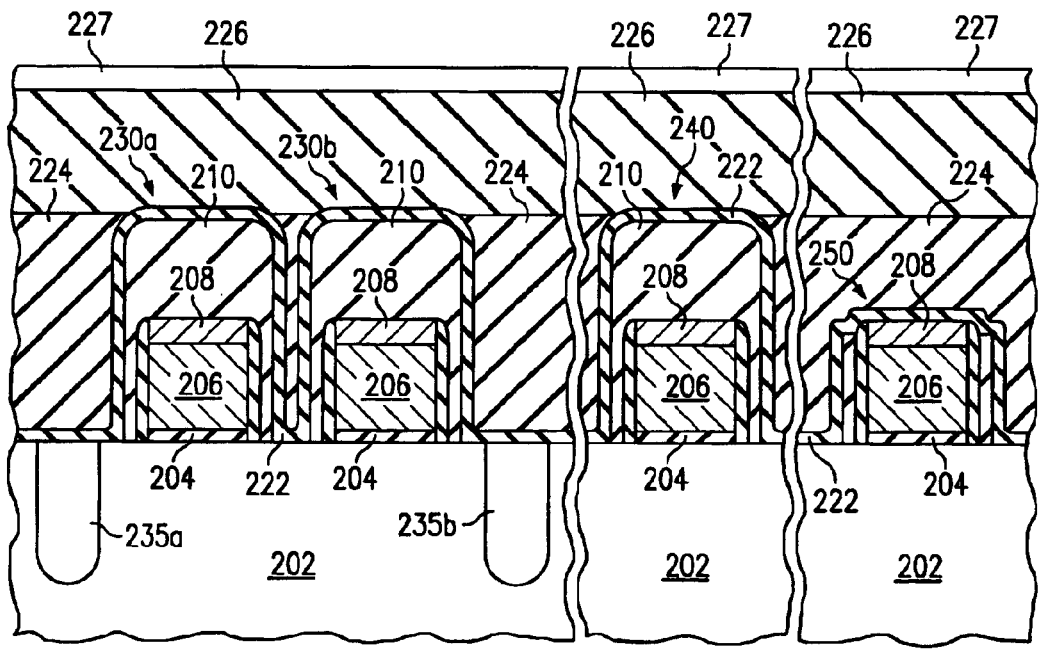
Figure 12:
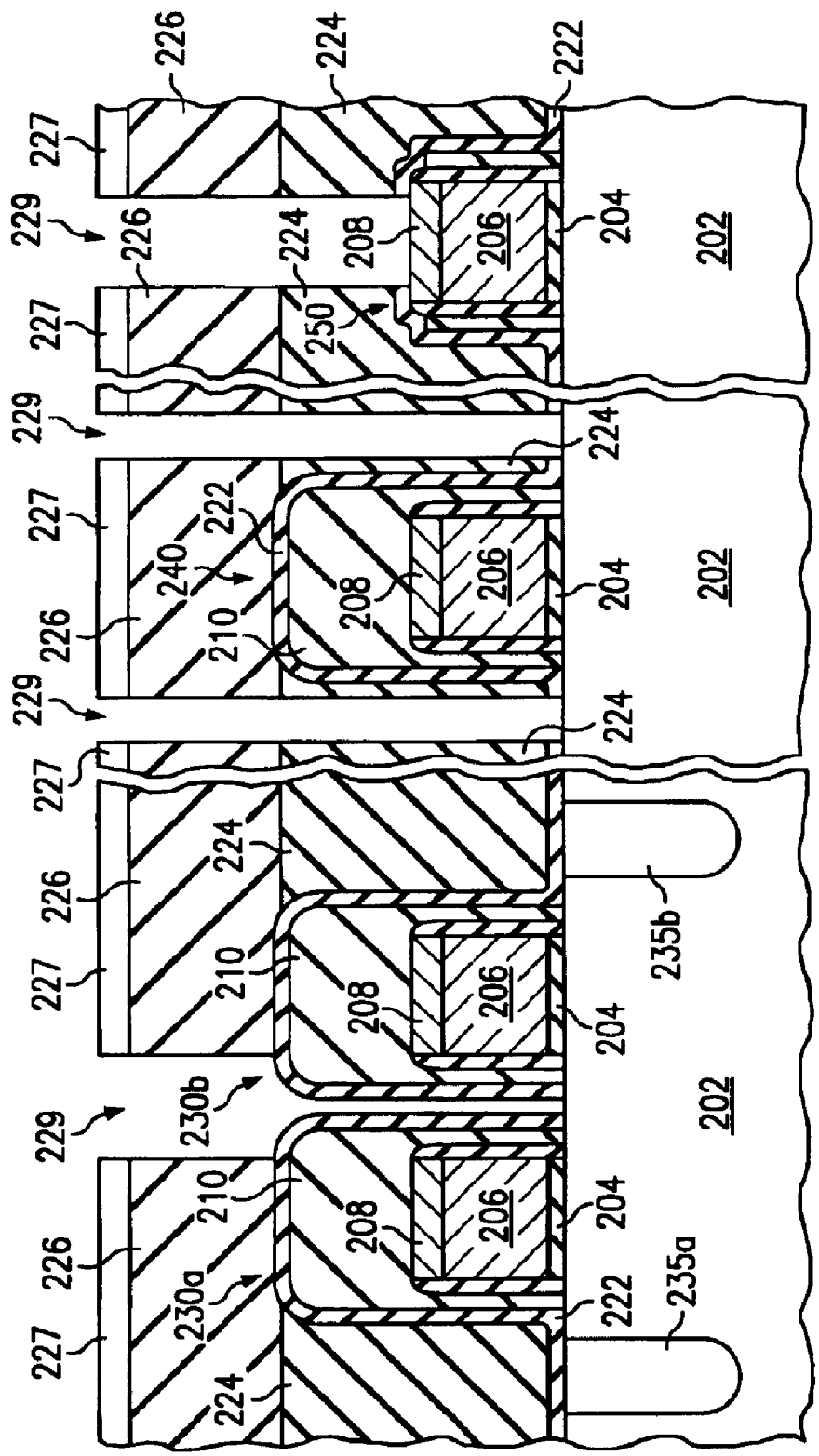

Referring now to FIG. 11, an oxide layer 226 is deposited, for example by the decomposition of TEOS. An optional layer 227 of polysilicon, preferably undoped, can then be deposited, e.g., by low-pressure chemical vapor deposition. The polysilicon layer 227 although not required can be used as a hard mask when etching the contact vias as shown in FIG. 12 to enhance the etch processing capability. A resist layer (not shown) can be used to pattern all of the contact vias with a single lithography step.

The contact vias 229 are provided to expose each of the elements (gates and substrate) that are to be coupled to the first level of metal (not shown). As shown in FIG. 12, the bitline contact (between the gates of transistors 230a and 230b) is self-aligned to the nitride layer 210 that encapsulates the access transistor gates 206/208. This nitride layer was undisturbed during the processing shown here.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, methods and steps described in the specification. As one of ordinary skill in the art will readily appreciate from the disclosure of the present invention, processes, machines, manufacture, materials, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, materials, means, methods, or steps.

What is claimed is:

1. A semiconductor device comprising:
    a semiconductor region;
    a first transistor disposed in the semiconductor region, the first transistor including:
        a source region;
        a drain region separated from the source region by a channel region;
        a gate region overlying the channel region and being insulated therefrom;
        a nitride layer overlying and physically contacting the entire gate region; and
    a second transistor disposed in the semiconductor region, the second transistor including:
        a source region;
        a drain region separated from the source region by a channel region;
        a gate region overlying the channel region and being insulated therefrom;
        a conductive contact electrically contacting a first portion of the gate region;
        an oxide layer abutting the conductive contact and a second portion of the gate region.

2. The device of claim 1 wherein the nitride layer encapsulates the gate region of the first transistor.

3. The device of claim 1 and further comprising a second nitride layer abutting a third portion of the gate region of the second transistor.

4. The device of claim 1 and further comprising a capacitor electrically coupled to the first transistor.

5. The device of claim 4 wherein the capacitor includes a plate disposed within a trench, the trench formed within the semiconductor region.

* * * * *